United States Patent [19]
Gupta

[11] Patent Number: 4,583,013
[45] Date of Patent: Apr. 15, 1986

[54] OSCILLATOR SIGNAL DETECT CIRCUIT

[75] Inventor: Rajiv Gupta, Brea, Calif.

[73] Assignee: Rockwell International Corporation, El Segundo, Calif.

[21] Appl. No.: 579,617

[22] Filed: Feb. 13, 1984

[51] Int. Cl.$^4$ .......................................... H03K 17/687
[52] U.S. Cl. ................... 307/480; 307/200 B; 307/453; 307/471; 307/481; 328/63
[58] Field of Search .............. 307/200 A, 200 B, 442, 307/443, 453, 468, 471, 480, 481, 517, 582–583, 269, 594; 328/61, 63, 74, 129.1, 140; 377/78–81

[56] References Cited

U.S. PATENT DOCUMENTS

| | | | |
|---|---|---|---|
| 3,986,046 | 10/1976 | Wunner | 307/269 X |
| 4,061,975 | 12/1977 | Sugai | 307/480 X |
| 4,117,348 | 9/1978 | Newman | 307/269 X |
| 4,233,524 | 11/1980 | Burdick | 307/468 |
| 4,352,995 | 10/1982 | Yoshida et al. | 307/442 X |
| 4,426,713 | 1/1984 | Shimizu et al. | 328/63 X |
| 4,504,745 | 3/1985 | Spence et al. | 307/453 X |

FOREIGN PATENT DOCUMENTS 0090834 8/1978 Japan .................... 307/480

Primary Examiner—Stanley D. Miller
Assistant Examiner—D. R. Hudspeth
Attorney, Agent, or Firm—H. Fredrick Hamann; David J. Arthur; S. Alfred Uchizono

[57] ABSTRACT

A circuit for use on an integrated circuit chip for detecting the operative connection of a crystal used to control an on-chip crystal controlled oscillator, which generates a cyclical clock signal, by detecting the presence or absence, respectively, of the cyclical clock signal and for providing an output control signal in response thereto to an on-chip terminal pad control circuit which automatically enables an on-chip terminal pad to be utilized as a clock signal output terminal pad if the cyclical clock signal presence is detected or as a clock signal input terminal pad otherwise. Also, a method of automatically switching the function of a terminal pad on an integrated circuit chip to function as a clock signal output terminal pad or as a clock signal input terminal pad in accordance with detecting the existence or non-existence of a cyclical clock signal generated on-chip.

17 Claims, 14 Drawing Figures

OSCILLATOR SIGNAL DETECT CIRCUIT

BACKGROUND OF THE INVENTION

1. Field of the Invention

This invention relates to providing an output control signal for automatically switching the function of a terminal pad on an integrated circuit chip to function as either an input terminal pad or an output terminal pad in response to the detection of the presence or absence of an on-chip generated oscillator signal. More specifically, the invention relates to a detect circuit which detects the absence or presence of an oscillator signal, presumably a crystal controlled oscillator, thereby detecting the presence or absence of a crystal connected to the oscillator circuit.

2. Description of the Prior Art

In the field of digital logic, a requirement for synchronization between various circuits is generally required. Typically synchronization between these various circuits can be obtained through the use of a common clock signal. It is frequently the case in integrated micrologic circuitry, where the integrated circuit chip will have mounted upon it a crystal which is a part of a high frequency digital clock. When this circuit or chip is required to function synchronously with other integrated circuit chips, the requirement for synchronization between the chips poses a decision as to which of the various chips is to function as the master clock chip, and which is to function as a slave chip with reference to the clock signal. Where it is not possible to foresee the eventual application to which the chip is to be applied, a near redundant design of the same chip is typically required, one designed for master-mode operation and the other mask designed for slave-mode operation. Another method of overcoming this uncertainty of mode, is to have those chips which do require an externally supplied clock signal, to be connected to the terminal pad of the chip in question dedicated specifically to function as an output terminal pad, and where the chip in question is to receive an externally supplied clock signal to its circuitry, to have a separate dedicated pad for the receipt of an input clock signal. This requires additional pad space or area on the chip which in chip design is usually at a premium. Another method of providing the necessary synchronization is to visually inspect the existence of a crystal mounted on the circuit chip in question, and if the crystal is mounted to then designate the chip as a master-mode chip and therefore select a master-mode chip with a crystal plugged into it. On the other hand, if by visual inspection a crystal is not to be used, then a slave-mode type of chip may be selected which functions in a slave mode, i.e., to function in a mode which receives an input clock signal from an external source.

Logic system design would be simplified, if there were some means for the chip itself to automatically enable it to function in either a master mode or slave mode, if it were capable of self-detecting the presence or absence of the cyrstal plugged into the oscillator circuit. If this were possible, then the detection of the existence or absence of the crystal could be used to control an output driver circuit for a clock signal to either function as an output driving circuit or to float that output terminal so that an external clock source could be connected to that terminal pad, without having interference from an internally generated clock. It would increase the versatility of such a chip because then it could be automatically used as either a master-mode or slave-mode chip without visual inspection or changing the mask set design for the chip to provide both a master-mode and a slave-mode chip depending on the application.

SUMMARY OF THE INVENTION

It is, accordingly, an object of the present invention to provide a circuit and method for detecting the absence or presence of a cyclical clock signal and for providing an output logic signal corresponding to the presence or absence of that clock signal. It is a further object to provide a circuit for use on an integrated circuit chip to detect the presence or absence of a cyclical clock signal and for providing an output control signal in response to the detection of the presence or absence of that clock signal to a float control circuit which automatically enables an on-chip terminal pad to be utilized as a clock signal output terminal pad if the clock signal presence is detected or as a clock signal input if the clock signal is not detected. It is a still further object to provide a crystal detect circuit for use on an integrated circuit chip to detect the presence or absence of a connected crystal and for providing an output control signal in response to that detection or absence or presence to a float circuit which automatically enables an on-chip terminal pad to be utilized as a clock signal output terminal pad if the clock signal presence is detected or as a clock signal input terminal pad if the clock signal presence is not detected.

These and other objects of the invention are realized in accordance with the circuit and method hereinafter described, which comprises first and second logic means, to which are applied the clock signal and the logical complement of the clock signal, hereinafter referred to as the inverse signal, wherein the output from each of these two logic means provides unlike logic states when the clock signal is present and provides a like signal at these outputs when the clock signal is not present. These output signals from these two logic means are provided to an exclusive/nor circuit which decodes the unlike and like signals to provide a presence or absence indication at the output of that exclusive/nor circuit. This output signal then is processed to provide the appropriate logic state to a float circuit which in turn controls the output driver state of the clock signal which is either being driven out to other external circuits or is to be floated in the event that the internally generated clock signal is not present. This would allow the output terminal pad to function as an input terminal pad to circuitry on the same chip as the clock circuitry. In specific embodiments of the present invention, each of the two logic means are further broken down into pluralities of stages, in one embodiment, the first logic means having at least three stages, and the second logic means having two stages, exactly one less stage than the first logic means. These stages are all connected in series within each logic means and the outputs of which are then connected to the two inputs of the exclusive/nor means. Typically, the circuit is implemented using field effect transistors (FETs) in integrated circuit configurations. Both enhancement-mode and depletion-mode FETs are used to carry out the various logic functions of each of the stages. In a further embodiment, the FETs are more specifically N-channel MOSFETs.

Also, a method is provided for automatically switching the function of an on-chip terminal pad to function as a clock signal input terminal pad or clock signal output terminal pad in accordance with detection of the existence or non-existence of an on-chip generated cyclical clock signal.

BRIEF DESCRIPTION OF THE DRAWINGS

The invention will be further described as to illustrative embodiments thereof in conjunction with the attached drawings in which.

DESCRIPTION OF THE PREFERRED EMBODIMENTS

System Overview

Figure 1:
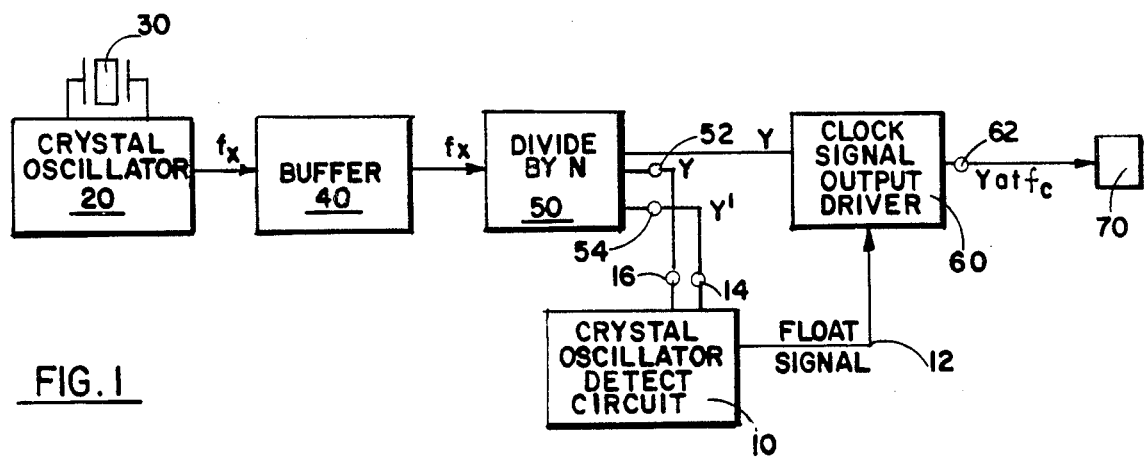
FIG. 1 is a block diagram indicating a typical application of the present invention in an integrated circuit system.

The block diagram of FIG. 1 shows the typical application of the crystal oscillator signal detect circuit of the present invention. There is shown Crystal Oscillator 20 with a crystal 30 shown connected to Crystal Oscillator. If the crystal 30 is connected as shown, then the output from the Crystal Oscillator 20 is a cyclical signal at frequency $f_x$, which signal is fed to Buffer 40, and then to Divide By N 50. The output from Divide By N is a cyclical clock signal at $f_x$ divided by N which is equal to $f_c$. The signal Y at frequency $f_c$ is fed to Clock Signal Output Driver 60. Also, two auxiliary outputs at 52, 54 which provide Y and its logical complement, Y' from Divide By N 50 are fed to Crystal Oscillator Detect Circuit 10, hereinafter to be referred to as the detect circuit. If the crystal 30 is not connected to Crystal Oscillator 20, the signals Y and Y' are DC logic levels of opposite state. This detect circuit 10 is the subject of the present invention. The output of the detect circuit 10 is Float Signal on lead 12, which is fed to and controls Clock Signal Output Driver 60. The output of Clock Signal Output Driver 60 at 62 is the clock signal Y at frequency $f_c$ which is fed to an integrated circuit chip terminal pad 70. If cyclical Y is inverted in passing through the output driver 60, then Y' it's inverse, will be fed to terminal pad 70.

The basic function of the detect circuit 10 is to provide an appropriate control signal to the output driver 60 such that if the signal Y and, consequently Y' are cyclical at the inputs 16 and 14 to the detect circuit 10 because the crystal 30 is connected to Crystal Oscillator 20, then Float Signal on lead 12 assumes a logic state such that the cyclical signal Y is allowed to pass through Clock Signal Output Driver 60 and is provided at the terminal pad 70 as a clock signal Y at frequency $f_c$. If the signals Y and Y' are not cyclical at the inputs 16 and 14 to the detect circuit 10 because the crystal 30 is not connected to Crystal Oscillator 20, then the detect circuit will detect the absence of cyclical Y and Y' and provide a control signal logic state on lead 12 to Clock Signal Output Driver 60 which turns off the output driver such that the terminal pad 70 is allowed to float, i.e., allowed to follow signals which are provided to terminal 70 from a source, external or otherwise, other than the output driver. In any event, the terminal pad 70 is allowed to function in the cyclical Y, Y' case as an output clock signal terminal pad, or in the DC Y, Y' case where the crystal 30 is not connected, as an input terminal pad. We shall now proceed to description of a preferred embodiment of the present invention diagrammed in FIG. 2.

First Preferred Embodiment

Figure 2:
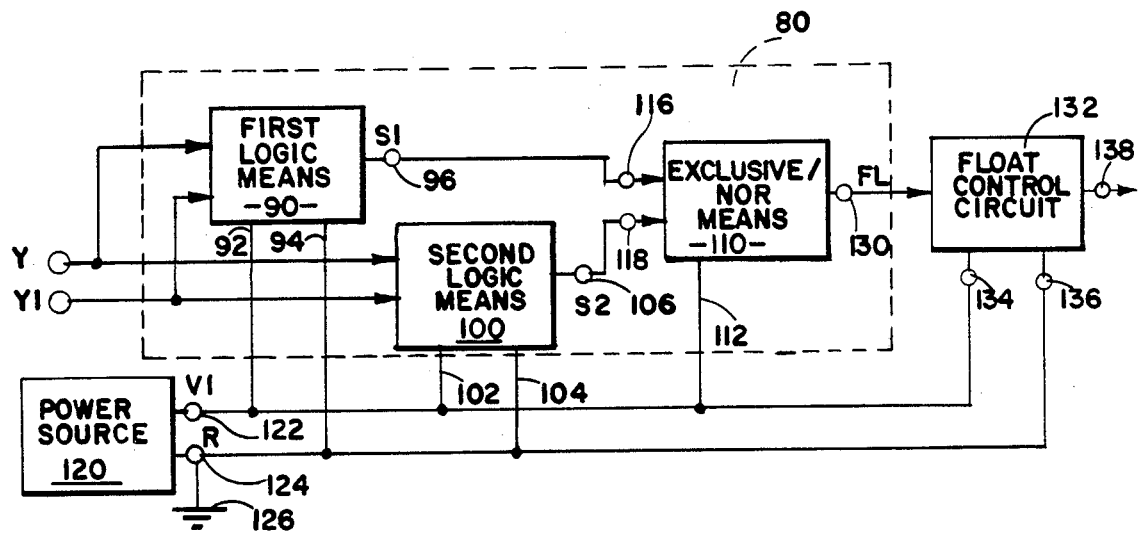
FIG. 2 is a block diagram of the present invention.

In FIG. 2, there is shown a first preferred embodiment of the present invention wherein the invention comprises that portion shown within the dashed box 80. There is shown First Logic Means 90, Second Logic Means 100, and Exclusive/Nor Means 110. Y and Y' are shown provided to both First Logic Means 90 and Second Logic Means 100. Also, external to box 80 is Power Source 120 shown providing supply voltage level V1 at supply voltage terminal 122 and reference level R at reference terminal 124. Typically, the reference level is connected to the circuit ground, as is shown at 126. The supply voltage level V1, typically +5 VDC for N-channel logic, and the reference level R, typically at ground, are shown provided to First Logic Means 90 and Second Logic Means 100 at 92 and 94, and 102 and 104, respectively. The supply voltage V1 is supplied to Exclusive/Nor Means 110 at 112. The supply voltage level V1 and the reference level R are also shown provided to Float Control Circuit 132 at 134 and 136, respectively. The output S1 from First Logic Means 90 at output terminal 96 is shown connected to the first input terminal 116 of Exclusive/Nor Means 110. The output signal S2 from Second Logic Means 100 at output terminal 106 is shown connected to the second input terminal 118 of Exclusive/Nor Means 110. The output signal FL from Exclusive/Nor Means 110 at output terminal 130 is shown connected to Float Control Circuit 132.

The functions of First Logic Means 90 and Second Logic Means 100, in combination, are such that the logic signal S1 is set to a high state and the logic signal S2 is set to a low state if the cyclical clock signal Y, and consequently Y', have been present for more than one clock cycle, and if they have not been cyclical for at least one clock cycle, then aside from transient conditions, both S1 and S2 assume the same logic state. During transient conditions, S1 and S2 may be in the same or opposite states. Exclusive/Nor Means 110 then interprets the two input signals such that if both the signals S1 and S2 are in the same logic state, then the output signal, FL, will be in a high state, and if the signals S1 and S2 are in unlike logic states the output, FL, will be in a low state. The output signal FL at 130, is then fed to Float Control Circuit 132. Float Control Circuit 132 will be described hereinbelow with reference to FIG. 7.

Second Preferred Embodiment

Figure 3:
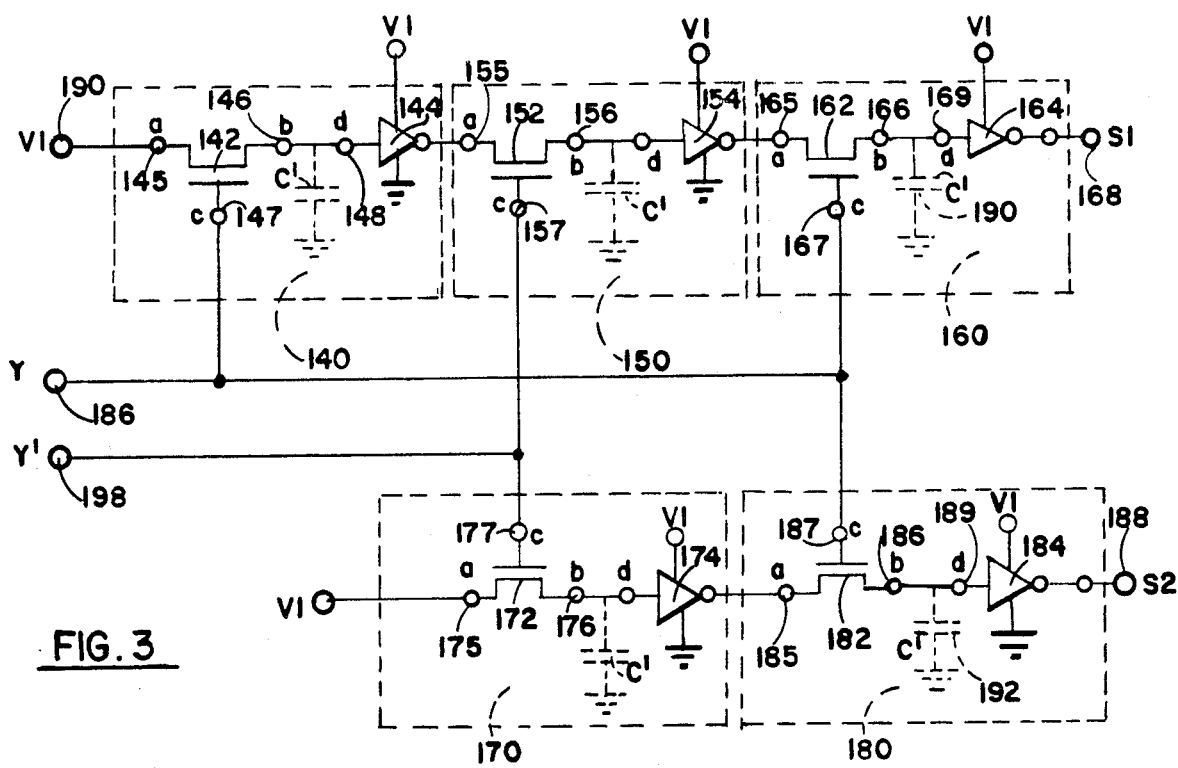
FIG. 3 is a combination block diagram/schematic diagram showing the plurality of stages which are used in first and second logic means of the embodiment shown in FIG. 2.

In FIG. 3 another preferred embodiment of the present invention is partially shown wherein First Logic Means 90 and Second Logic Means 100 of FIG. 2 are provided with greater detail. FIG. 3 is a combined schematic and block diagram representation of this preferred embodiment. In FIG. 3, there are shown three adjacent dashed boxes 140, 150, and 160 in the upper portion of the figure and two adjacent dashed boxes 170 and 180 in the lower portion of the figure. Each of the boxes 140, 150, 160, represents one stage of a first logic means and each of the boxes 170 and 180 represents one stage of a second logic means, where these first and second logic means are such as are shown as 90 and 100, respectively, in FIG. 2 of the overall detect circuit 10.

Each of the stages 140, 150, 160, 170, and 180, are identical except for external connections and, therefore, it suffices to describe one of the stages. For example, looking at the first stage 140 of the first logic means (upper dashed boxes), there is a transfer gate 142 connected to a logic signal inverter 144. The transfer gate 142 has an input terminal a at 145, an output terminal b at 146, and a control terminal c at 147. The output terminal b of the transfer gate 142 is shown connected to the input d at 148 of the inverter 144. For the other stages 150, 160, 170, and 180, input, output, and control terminals for their respective transfer gates 152, 162, 172, and 182, are indicated by letters a, b, and c, respectively. Additionally, the input to each of the inverters 154, 164, 174, and 184 is indicated by the letter d. Also indicated in each of the boxes 140, 150, 160, 170, and 180 are the parasitic capacitances symbolized by C' and shown between the input d to the inverter and ground.

The first logic means comprises the connection of the stages 140, 150, and 160 in serial connection as shown in the diagram where the output from the inverter of a preceding stage is connected to the input terminal of the transfer gate of a following stage. The inputs 145, 175 to the first stage of each of the first and second logic means 140 and 170, respectively, are connected to the supply voltage reference level V1. The output from the last stage in each of the first and second logic means provides the output signals S1 at 168 and S2 at 188, respectively. These signals, S1 and S2, are fed to the exclusive/nor means such as is shown in FIG. 2 at 116 and 118. Also shown in FIG. 3 are the clock signal connections Y and Y' connected to the control terminal c of each of the transfer gates for each of the stages such as is shown at 147 in the first stage 140 of the first logic means.

Figure 4:
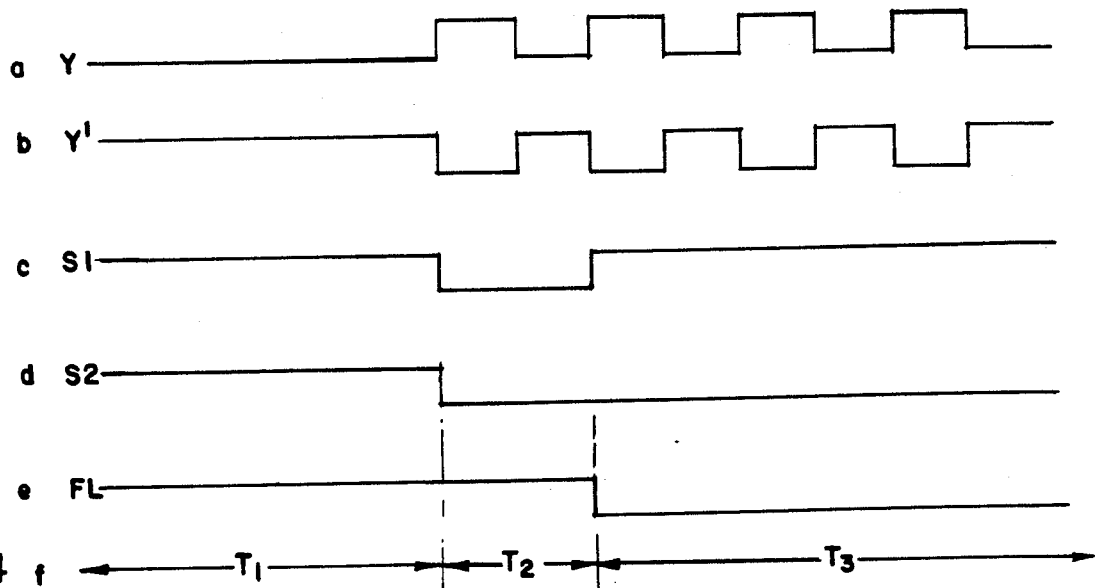
FIGS. 4a-4f are a timing diagram showing the time relationships between the signals which are used to operate the circuit of the present invention.

In FIG. 4 there are shown the typical waveforms of the signals which are used to operate the detect circuit of the present invention. The signals are shown on a common time base, here broken down into three consecutive time intervals, $T_1$, $T_2$, and $T_3$ of FIG. 4f, to show the time relationships between these signals. In the upper two waveforms, FIGS. 4a and 4b, there are shown the clock signal Y and its inverse Y', where Y' is the logical complement of the clock signal Y. These signals are typical of that which appear at the output of the divide by N circuit 50 of FIG. 1 at terminals 52 and 54, respectively, and which are typical of signals which are applied at terminals 16 and 14 of the crystal oscillator detect circuit 10 of FIG. 1, which are applied to the First Logic Means and Second Logic Means 90, 100, of FIG. 2, and which are applied to the control terminals c of each of the transfer gates in FIG. 3. The waveforms Y and Y' are shown for the three successive time periods, $T_1$, $T_2$, and $T_3$. During the time period $T_1$, Y and Y' are shown in a steady state DC condition with Y at a low level and Y' at a high level. During time interval $T_2$, Y and Y' begin to oscillate and continue to oscillate during time period $T_3$. Though any suitable clock frequency can be used, the oscillating frequency is typically on the order of three megahertz, which frequency could be derived from a 12 megahertz crystal oscillator which has been divided down by a factor of 4. In FIGS. 4c and 4d, there are the typical waveforms for S1 and S2 for the time periods $T_1$, $T_2$, and $T_3$ where the specific response is that which one could expect from the embodiment of FIG. 2 using the first and second logic means embodiments of FIG. 3. During the time interval $T_1$, S1 and S2 are both high, and during time period $T_2$, they are both low. As to its effect on the exclusive/nor circuit to which these signals are fed, the effect is the same during $T_1$ and $T_2$ since in both cases S1 and S2 are in the same logic state producing a logic high state for signal FL at the output of the exclusive/nor circuit. However, as can be seen during the time period $T_3$, the logic state of signal S1 has now changed to a high state and the logic state of S2 has remained low. Therefore, since the logic states of the two inputs to the exclusive/nor circuit are now unlike, the exclusive/nor circuit will produce a change to a logic low state at its output as shown in the FL signal of FIG. 4e. In relation to the FIG. 2 block diagram, this signal, FL, is shown at 130 and is provided as an output from Exclusive/Nor Means 110 to Float Control Circuit 132.

Third Preferred Embodiment

Figure 5:
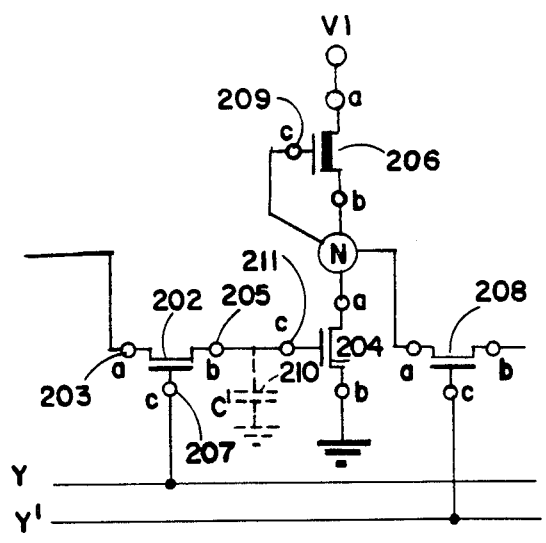
FIG. 5 is a detailed schematic diagram of one stage of the present invention.

A more detailed schematic diagram is provided in FIG. 5 of an implementation of the transfer gate and the inverter combination which comprises one of the stages and also the transfer gate for a following stage. In the diagram, the devices 202, 204, 206, and 208 are field effect transistors (FETs). More particularly, FETs 202, 204, and 208 are enhancement-mode FETs. FET 206 is a depletion-mode FET. One transfer gate is the enhancement-mode FET 202 which has input, output, and control terminals a at 203, b at 205, c at 207, respectively. The output terminal b at 205 is connected to the input of the inverter comprising the enhancement-mode FET 204 and the depletion-mode FET 206 connected together at the node N. Control over the transfer gate 202 is provided by the signal Y applied to c at 207. FET 208 is the trsnsfer gate for the next stage and is controlled by the inverse signal Y'. Of particular note is the parasitic capacitance C' at 210 between that point and ground. C' serves to store that charge which is allowed to flow through the transfer gate 202 when it is conducting in response to the signal Y' on the control terminal c at 207. The depletion-mode FET 206 is shown connected with its control terminal c at 209 connected to the node N allowing the FET 206 to act as a load to the FET 204. Also, the signal on N is inverted relative to the input signal on terminal c at 211 of FET 204.

Fourth Preferred Embodiment

Figure 6:
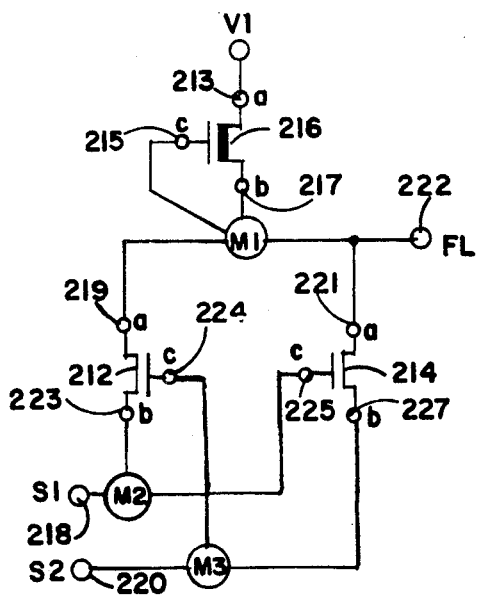
FIG. 6 is a schematic diagram showing the details of the exclusive/nor circuit of the present invention.

In FIG. 6 there is shown another preferred embodiment of the present invention showing in more specific detail the design of the exclusive/nor circuit which is used to decode the signals S1 and S2 applied to it from first and second logic means, respectively. In FIG. 6 there are shown the two opposing enhancement-mode FETs 212 and 214. In addition, a load arrangement is provided by the depletion-mode FET 216 where a first conduction path terminal a at 213 of FET 216 is connected to the supply voltage level V1. A control terminal c at 215 and a second conduction path terminal b are both shown connected to the node M1 which is common to a first conduction path terminal a of each of the enhancement-mode FETs 212 and 214 at 219 and 221, respectively. The inputs to the circuit are shown at 218 and 220 where signals S1 and S2 are applied, respectively. S1 is applied to the second conduction path terminal b at 223 of FET 212 and to the control terminal c at 225 of FET 214 through the common node M2. Also shown is the signal S2 applied to the second conduction path terminal b at 227 of FET 214 and the control terminal of c at 224 of FET 212 through the common node M3. The output from the circuit, FL, is taken from the node M1 which is common to the first conduction path terminal a of FETs 212 and 214 at 219 and 221, respectively, and the second conduction path terminal b at 217 of FET 216 and the control terminal c at 215 of FET 216. This signal is shown output at 222.

Output Driver Circuit And Float Control Circuit

Figure 7:
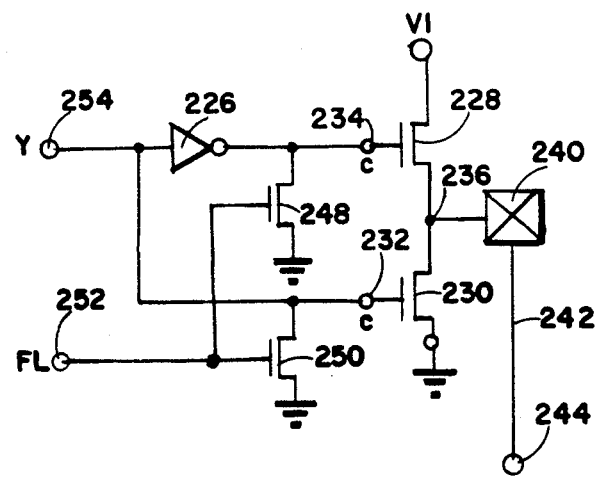
FIG. 7 is a schematic block circuit diagram combined showing a typical application of the use of the output signal from the present invention as applied to an output driver circuit.

The clock signal output driver circuit is shown in FIG. 7 along with elements comprising the float control circuit indicated by the box 132 in FIG. 2. The Clock Signal Output Driver is symbolized by the box 60 in FIG. 1. In a typical application and as is the case in the description provided herein, the Clock Signal Output Driver 60 of FIG. 1 can be considered to include the float control circuit such as is indicated by box 132 of FIG. 2. That assumption is made for the purposes of the discussion here.

In FIG. 7 there is shown an inverting push-pull driver circuit comprising an inverter 226 and two enhancement-mode FETs 228 and 230. Examination of the circuit reveals that if clock signal Y is applied to a control terminal c at 232 of enhancement-mode FET 230, then the inverse of Y will be applied to the control terminal c at 234 of the enhancement-mode FET 228. Therefore, so long as enhancement-mode FETs 248 and 250 are not conducting, either one or the other of the two FETs 230 and 228 is conducting at any given time. The push-pull arrangement is connected between the supply voltage level V1 and the reference level here indicated as at ground potential. The output from this driver circuit is taken at 236 and is connected to an on-chip terminal pad 240. Also leading to the terminal pad 240 is the lead 242 which goes to terminal 244. Terminal 244 is symbolic of other circuitry on the chip which utilizes the clock signal in some fashion. Therefore, if the clock signal Y is applied at input terminal 254 and its inverse Y' is being driven out to the terminal pad 240 from the push-pull driver, the on-chip generated clock signal Y, or its inverse Y', is being utilized by the circuit symbolized by the terminal 244. However, if a cyclical clock signal Y is not present at 254 because a crystal such as 30 in FIG. 1 is not connected to the Crystal Oscillator 20, then it is desirable to utilize an external clock to drive the circuit symbolized by the terminal 244. This external clock signal would be introduced onto the terminal pad 240 by an actual lead bonded to that pad. It is not shown in this figure. In this case, where an external clock signal is to be used, it is desirable to isolate the terminal pad 240 from the interfering effects of the driver circuit operating in a conducting state. To accomplish this, the float control circuit comprising the enhancement-mode FETs 248 and 250 is utilized. To float the terminal pad 240, the two FETs 248 and 250 are switched to a conducting state thereby driving the control terminals 232 and 234 towards ground, thereby controlling the driver FETs 230 and 228 to an off condition. In this fashion, the output terminal 240 is isolated from the clock signal driver circuit.

Fifth Preferred Embodiment

Figure 8:
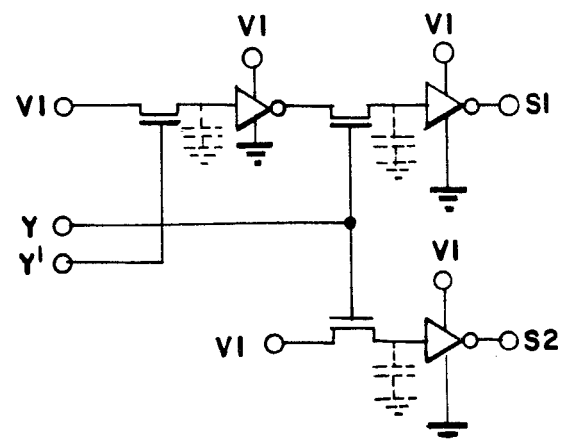
FIG. 8 shows a combined schematic block/block diagram wherein the total number of stages is limited to three stages.

FIG. 8 is similar to the FIG. 3 embodiment with the exception that instead of the first logic means having three stages, and the second logic means having two stages, the embodiment shown here has two stages for the first logic means and one stage for the second logic means. Otherwise, the circuit functions in a manner similar to that of as the circuit in FIG. 3 with somewhat higher susceptibility to noise and transients. The output signals S1 and S2 provide the similar type of like and unlike signals to drive the exclusive/nor circuits such as are shown in FIG. 6.

Sixth Preferred Embodiment

Figure 9:
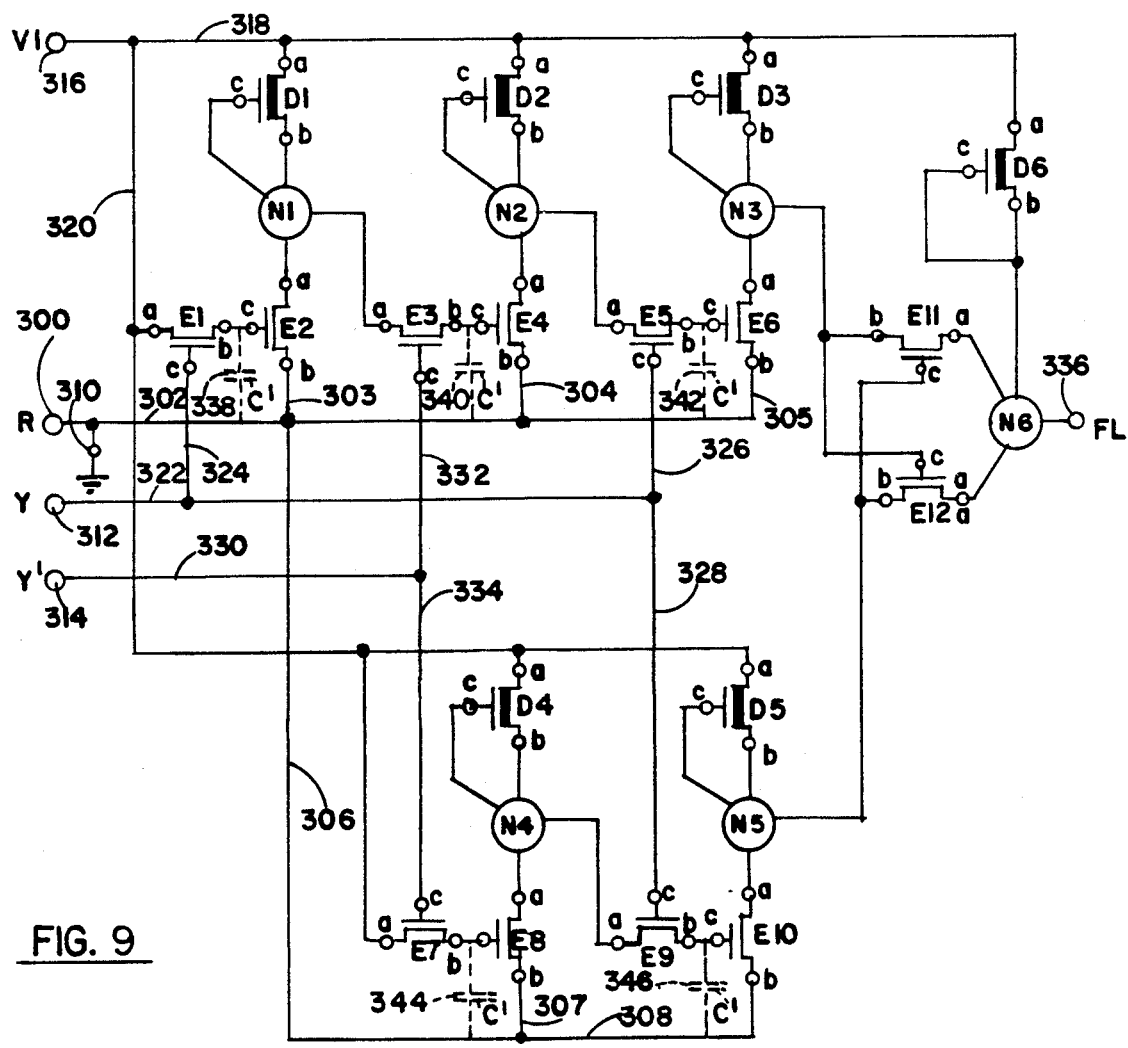
FIG. 9 is a schematic diagram of the preferred embodiment of the present invention.

In FIG. 9, there is shown a crystal detect circuit for use on an integrated circuit chip in accordance with the present invention. This circuit is used to detect the presence or absence of a crystal connected to an oscillator circuit providing a cyclical clock signal and for providing an output control signal in response to that detection to a float circuit which automatically enables an on chip terminal pad to be utilized as a clock signal output terminal pad if the clock signal presence is detected or as a clock signal input terminal pad otherwise.

The circuit comprises twelve enhancement-mode FETs, designated E1 through E12, and six depletion-mode FETs designated D1 through D6. Additionally, six circuit nodes, N1 through N6 are defined. Input terminals 312 and 314 are provided for the application of the clock signals Y and Y' to the circuit. The supply voltage level V1 is provided to terminal 316, and is provided to the various circuit elements via leads 318 and 320. V1 is applied to the first conduction path terminal, a, of each of the following FETs: D1, D2, D3, D4, D5, D6, E1, and E7. The reference level, R, typically tied to ground as shown, is applied to terminal 300. This reference level or ground connection is made to the second conduction path terminal b of each of the FETs E2, E4, E6, E8, and E10 via leads 302, 303, 304, 305, 306, 307, and 308. The Y signal applied at terminal 312 is applied to the control terminal c of each of the FETs E1, E5, and E9 via leads 322, 324, 326, and 328. The inverse signal Y', the logical complement of Y, applied at terminal 314 is connected to the control terminal c of FETs E3 and E7 via leads 330, 332, and 334. The second conduction path terminal b of each of the FETs E1, E3, E5, E7, and E9 is connected, respectively, to the control terminal c of each of the FETs E2, E4, E6, E8, and E10.

Node N1 is connected to the control terminal c and second conduction path terminal b of FET D1 and to the first conduction path terminal a of each of the FETs E2 and E3. Node N2 is connected to the control terminal c and the second conduction path terminal b of FET D2 and to the first conduction path terminal a of each of the FETs E4 and E5. Node N3 is connected to the second conduction path terminal b and the control terminal c of FET D3 and to the first conduction path terminal a of FET E6 and to the second conduction path terminal b of FET E11 and to the control terminal c of FET E12. Node N4 is connected to the control terminal c and the second conduction path terminal b of FET D4 and to the first conduction path terminal a of each of the FETs E8 and E9. Node N5 is connected to the control terminal c and conduction path terminal b of FET D5 and the first conduction path terminal a of FET E10 and to the second conduction path terminal b of FET E12 and to the control terminal c of FET E11. Node N6 is connected to the first conduction path terminal a of each of the FETs E11 and E12 and to the control terminal c and second conduction path terminal b of FET D6. The output signal is taken from the node N6 and is indicated as FL at terminal 336. Also shown between each of the control terminals of E2, E4, E6, E8, and E10, is a parasitic capacitance C' shown in dashed lines, at 338, 340, 342, 344, and 346, and of operative effect connected between the control terminal c of FETs E2, E4, E6, E8, and E10 and ground and is included for purposes of explaining the operational characteristics of this circuit.

Seventh Preferred Embodiment

A further embodiment of the present invention is a method of automatically switching the function of terminal pad on an integrated circuit chip to function either as a clock signal output terminal pad or as a clock signal input terminal pad in accordance with whether an on-chip cyclical clock signal is generated on the chip. The method comprises the steps of generating first and second logic signals, such as S1 and S2 generated by the first, second, fifth, and sixth embodiments and illustrated in FIGS. 2, 3, 8, and 9. These logic signals, S1 and S2, are then set to various combinations of logic states in accordance with the presence or absence of the cyclical clock signals Y and Y' of the above referred embodiments. The next step is performing an exclusive/nor logic on the S1 and S2 signals producing an output logic signal, such as the FL signal referred to in the above embodiments. Next, the FL signal is coupled to a float control circuit such as shown in FIGS. 2 and 7, to finally cause the float control circuit to either float or not float the terminal pad in question and allowing it to function as either an input or output signal terminal pad.

Operation of the Circuit

In FIG. 2 the output signals S1 and S2 will be set to high and low states, respectively, if the clock signal has been present for more than one clock cycle such as is indicated in the waveforms S1 and S2 of FIGS. 4c and d during time periods $T_2$ and $T_3$. During the time interval $T_1$, no cyclical clock signal is present. Signals S1 and S2 are applied to the exclusive/nor means 110 at 116 and 118, respectively, and when S1 and S2 are of a like state, the output FL at 130 is caused to be in a high state. If, however, S1 and S2 are of unlike states, then the exclusive/nor means will decode the condition by outputting an FL level which is low. This signal is then fed to the float control circuit. If that float control circuit is as disclosed in the FIG. 7, comprising FETs 248 and 250 as shown connected to the output driver circuit, then with the FL signal in a high state on terminal 252 (S1 and S2 alike), FETs 248 and 250 will conduct, thereby causing the control terminal c of each of the FETs 228 and 230 to be driven towards ground, causing FETs 228 and 230 to turn off. This then allows the terminal pad 240 to float which is the desired result. If, however, the signal applied to 252 is in a low state (S1 and S2 unlike), then FETs 248 and 250 will be turned off. This allows the driver circuit to function in a normal fashion allowing the terminal pad 240 to be driven by the signal Y applied to terminal 254. The actual signal on pad 240 will be inverted relative to signal Y.

In FIG. 3, the operation of the circuit which comprises the first and second logic means of FIG. 2 is as follows:

During the time interval $T_1$ of FIG. 4, the clock signals Y and Y' are in a steady state as indicated therein. Y is shown at a low level and Y' at a high level. With Y at a low level, FETs 142, 162, and 182 are in an off condition. Therefore, the outputs S1 and S2 will both be at a logic level which is the inverse of that which appears on the inputs d at 169 and 189 of the two inverters 164 and 184, respectively. Since this is a steady state condition, the parasitic capacitances C' at 190 and 192 are discharged to a low condition over a period of time. Therefore, the S1 and S2 outputs at 168 and 188, respectively, from the two inverters 164 and 184 are both the inverse of this low condition, i.e., they are both in a high condition such as is shown in FIGS. 4c and 4d during the time period $T_1$. S1 and S2 are then fed to the exclusive/nor means such as shown at 110 in FIG. 2, which will accept like states and correspondingly, put out a logic high level.

At the end of $T_1$, S1 at 168 will go to a low state, and S2 will go to a low state. At the end of the first cycle corresponding to the second positive going transition of Y and the end of period $T_2$, S1 will go to a high state and S2 will remain in a low state.

Though the specific details of the operation of a given embodiment may differ slightly from that which is presented hereinbelow, one skilled in the art can easily provide the necessary details to come to an understanding of the operation of those embodiments which are not described. The description of the system given here will be of the system as shown in FIG. 2 with specific portions such as the First Logic Means and Second Logic Means 90 and 100, the Exclusive/Nor Means 110, and the Float Control Circuit all described in greater detail with reference to first and second logic means represented by FIG. 3, the exclusive/nor means as represented by FIG. 6, and the float control circuit as represented by FIG. 7. These figures show portions of the system which are compatible with each other and which when combined together provide significant details for the implementation of FIG. 2. In addition, the set of waveforms which will be used in this description are those as are given in FIG. 4.

FIG. 7 shows the details of the float control circuit 132 of FIG. 2. Examining the circuit, it can be seen that if the gate terminal of FETs 248 and 250 are driven to a logic high condition, FETs 248 and 250 will conduct, thereby pulling the gate terminals of 234 and 232 of FETs 228 and 230, respectively, towards the ground potential. Under those conditions, the FETs 228 and 230 will be turned off. This would then correspond to the condition where the terminal pad 240 is allowed to float and to be responsive to external signals being applied to the terminal pad 240. If the float signal FL as applied to 252 goes to a low condition, then FETs 248 and 250 will be turned off allowing the signal Y to be driven to the output stages and to ultimately allow Y' to appear on the terminal pad 240 because of the inversion through the push-pull driver.

Therefore, in summary, when the float signal FL is in a high condition, terminal pad 240 is allowed to float, and when the float signal is in a low condition, the internally generated clock signal Y is allowed to be driven out to the terminal pad 240.

In a typical configuration the float signal FL is output from a circuit such as is shown in FIG. 6. An examination of FIG. 6 shows that conduction through 212 and 214 may be prevented by controlling the second conduction path terminal b at 223 and 227, respectively, of each of FETs 212 and 214 to be near the potential of node M1, or by biasing the FETs 212 and 214 to an off condition by controlling the gate potential on terminals c at 224 and 225 of each of FETs 212 and 214 to be near the potential of the second conduction path terminal d of each of those two FETs. These two conditions obtain when S1 and S2 are both in the same logic state, either both high or both low. When either S1 is high and S2 is low or when S2 is low and S1 is high, conduction will occur through either FET 212 or 214, causing the potential at node M1 to go to a low state. Otherwise, the potential on the node M1 will remain in a high state.

Assuming that the output terminal 222 of FIG. 6 is connected to the terminal 252 of FIG. 7, it can be concluded that when S1 and S2 are alike, and consequently, that node M1 is at a high level, that the output terminal pad 240 will be in a float condition. On the other hand, if S1 and S2 are in unlike states, then the float signal FL will be in a low state, and consequently, the inverse of the signal appearing on terminal 254 will then be driven to the terminal pad 240.

A typical first and second logic means for the FIG. 6 and FIG. 7 combination described above would be a circuit such as presented in FIG. 3. The basic concept behind the circuit FIG. 3 is to propagate the potential V1 and charge associated therewith from one stage to the next until the signal appears on the output such as shown at S1 in FIG. 3. The propagation of the high level state represented by voltage level V1 occurs because of the opening and closing of the transfer gate 142. More specifically, as the signal appearing on the terminal 186, in this case shown as Y, goes to a high state, the transfer gate 142 is permitted to conduct allowing the potential V1 to charge the parasitic capacitance C'. As the state of Y goes low, the transfer gate 142 is closed and the charge on the C' parasitic capacitance is stored thereon at a potential near V1. Absent significant leakage from this capacitance, the potential at the input to the inverter 144 will be maintained in a logic state corresponding to the V1 level. The output of the inverter 144 will therefore be low at the first conduction path terminal 155 of FET 152. This potential will then be propagated forward to the next parasitic capacitance C'. If that is a low state that is propagated to that C', then the output of the inverter 154 will be high and, similar to that with the transfer gate 142 and inverter 144, this state will be propagated forward to the output of the stages at S1 as a low state. When this string of stages, shown in the upper portion of FIG. 3, is contrasted to the operation of the lower two stages, where the lower two stages function in a similar fashion as described with reference to the upper three stages, using a similar analysis, one can see that the potential on 176, the second conduction path terminal of FET 172, will be at a high state, the potential at the second conduction path terminal 186 of FET 182 will be at a low state, and therefore the output from the inverter 184 will be in a high state at 188 for those cases where the clock signals Y and Y' have been in existence or have been oscillating for several cycles. Thus, under these circumstances S1 will be in a low state and S2 will be in a high state, and if such potentials are applied to the exclusive/nor circuit of FIG. 6 will cause the float signal FL to be in a low state, thereby allowing the inverse of the signal appearing on terminal 254 of FIG. 7 to be driven out to the terminal pad 240.

The contrasting situation as to that described above where clock signals do exist is this situation where Y and Y' are at a steady state DC voltage levels. Under such conditions and noting that under steady state conditions, the transfer gates 152 and 172 as driven by Y' or the transfer gates 162 and 182 as driven by Y will either both be on or both be off. Since Y and Y' are assumed to be a steady state, propagation of the signals does not take place. Therefore, under steady state conditions the potential appearing on 166 and 186, in steady state, will cause the the outputs S1 and S2 as appearing at 168 and 188, respectively, to be at the same level. Under such conditions the FIG. 6 exclusive/nor circuit will provide a high level logic state at terminal 222 and to the input terminal 252 of FIG. 7 causing the FETs 248 and 250 to conduct and thereby allowing the terminal pad 240 to be in a float condition.

It should be noted that a key feature of the present invention is the ability to discriminate the existence of a periodic oscillating signal from transient noise signals which may inadvertently trigger the float circuitry. The key factor here is the feature wherein the number of stages in the upper portion, in this case three stages, is exactly one greater than the number of stages in the lower portion, here shown with two stages. A similar arrangement may be developed in accordance with the schematic of FIG. 8 wherein there are shown two stages for the first logic means, i.e., the upper portion of the figure and one stage for the lower portion or the second logic means. In the other direction, the concept may be extended to more than three stages in the upper portion and two stages of the lower portion of FIG. 3 to where N stages may be provided in the upper portion and N−1 stages are provided in the lower portion to provide increased protection against noise and false alarm.

Thus, the foregoing objects, including the object of providing a circuit for detecting the absence or presence of a cyclical clock signal and for providing an output logic signal corresponding to the presence or absence of that clock signal are achieved by these embodiments of the invention through the novel approach described hereinabove.

Although the invention has been described and illustrated in detail, it is to be clearly understood that the same is by way of illustration and example only, and is not to be taken by way of limitation, the spirit and scope of the invention being limited only by the terms of the appended claims.

What is claimed is:

1. A circuit for detecting the absence or presence of a cyclical clock signal and for providing an output logic signal corresponding thereto, said circuit characterized by being operable from an external power source providing supply voltage and reference levels, and further characterized by being responsive to said clock signal which cycles between high and low states corresponding to supply voltage and reference levels, respectively, and to an inverse signal which is the logical complement of said clock signal, said circuit comprising:

first logic means characterized by being operable from said external power source for providing a first logic signal responsive to said clock and inverse signals;

second logic means characterized by being operable from said external power source for providing a second logic signal responsive to said clock and inverse signals; and exclusive/nor means characterized by being operable from said external power source for performing an exclusive/nor logic function with respect to said first and second logic signals coupled thereto and for outputting said output logic signal in response to performance of said exclusive/nor function;

said first and second logic signals characterized by high and low logic states corresponding to supply voltage and reference levels, respectively, said first logic signal being set to a high state and said second logic signal being set to a low state if said cyclical clock signal has been present for more than one clock signal and both being set to the same state if said cyclical clock signal is absent;

the coincidence of either like or unlike logic states of first and second logic signals causing the logic state of said output logic signal to be either high or low, respectively.

2. A circuit for detecting the absence or presence of a cyclical clock signal and for providing an output logic signal corresponding thereto, said circuit characterized by being operable from an external power source providing supply voltage and reference levels at supply voltage and reference terminals, respectively, and further characterized by being responsive to said clock signal which cycles between high and low states corresponding to supply voltage and reference levels, respectively, and to an inverse signal which is the logical complement of said clock signal, said circuit comprising:

first logic means having a first output terminal for providing a first logic signal at said first output terminal responsive to said supply voltage and reference levels and said clock and inverse signals;

second logic means having a second output terminal for providing a second logic signal at said second output terminal responsive to said supply voltage and reference levels and said clock and inverse signals; and exclusive/nor means having first and second input terminals and a third output terminal for performing an exclusive/nor logic function with respect to said first and second logic signals coupled to said first and second input terminals, respectively, and for outputting said output logic signal at said third output terminal in response thereto;

said first and second logic signals characterized by high and low logic states corresponding to supply voltage and reference levels, respectively, said first logic signal being set to a high state and said second logic signal being set to a low state if said cyclical clock signal has been present for more than one clock cycle and being set to the same state if said cyclical clock signal is absent;

the coincidence of either like or unlike logic states of first and second logic signals causing the logic state of said output logic signal to either be high or low, respectively.

3. The circuit according to claim 2:
in which said first logic means comprises a plurality of at least three stages, including a first stage and a final stage, all serially connected between said supply voltage terminal and said first input terminal of said exclusive/nor means; and in which said second logic means comprises a plurality of exactly one less stage than said first logic means including a first stage and a final stage, all serially connected between said supply voltage terminal and said second input terminal of said exclusive/nor means.

4. The circuit according to claim 3, in which each of said plurality of stages of both said first and second logic means comprises:

a transfer gate having input, output, and control terminals, said input terminal defining an input to said stage; and an inverter which is operated from said external power source having input and output terminals, said output terminal defining an output of said stage;

said output terminal of said transfer gate connected to said input terminal of said inverter;

said stages where connected to each other, connected so that said output of one stage is coupled to said input of a next adjacent following stage;

each of said inputs to said first stage of said first and second logic means connected to said supply voltage terminal, and each of said outputs of said final stage of said first and second logic means connected to said first and second inputs of said exclusive/nor means, respectively;

said clock signal coupled to said transfer gate control terminal of alternate stages, starting with said last stage and proceeding toward said first stage in each of said first and second logic means;

said inverse signal coupled to all the remaining control terminals.

5. The circuit according to claim 4:
in which said transfer gate comprises a first enhancement-mode FET having first and second conduction path terminals and a control terminal corresponding to input, output, and control terminals of said transfer gate, respectively; and in which said inverter comprises a first depletion-mode FET and second enhancement-mode FET, each of said FETs having first and second conduction path terminals and a control terminal;

said first conduction path terminal of said first depletion-mode FET connected to said supply voltage terminal, said second conduction path and control terminals of said first depletion-mode FET connected to said first conduction path terminal of said second enhancement-mode FET defining said output terminal of said inverter, said second conduction path terminal of said second enhancement-mode FET connected to said reference terminal, said control terminal of said second enhancement-mode FET defining said input terminal to said inverter which is connected to said second conduction path terminal of said first enhancement-mode FET;

said first conduction path terminal of said first enhancement-mode FET defining an input to said stage.

6. The circuit according to claim 2, in which said exclusive/nor means comprises:

a first enhancement-mode FET having first and second conduction path terminals and a control terminal;

a second enhancement-mode FET having a first conduction path terminal connected to said first conduction path terminal of said first enhancement-mode FET, a second conduction path terminal connected to said control terminal of said first enhancement-mode FET, and a control terminal connected to said second conduction path terminal of said first enhancement-mode FET; and a depletion-mode FET having a first conduction path terminal connected to said supply voltage terminal, a second conduction path terminal connected to said first conduction path terminals of both of said first and second enhancement-mode FETs, and a control terminal connected to said second conduction path terminal of said depletion-mode FET;

said second conduction path terminal of said first enhancement-mode FET defining said first input terminal of said exclusive/nor means, said second conduction path terminal of said second enhancement-mode FET defining said second input terminal of said exclusive/nor means, and said first conduction path terminals of both of said first and second enhancement-mode FETs connected together defining said third output terminal of said exclusive/nor means.

7. The circuit according to claim 2, in which said exclusive/nor means comprises:

first, second, and third nodes;

a first depletion-mode FET and first and second enhancement-mode FETs, each of said FETs having first and second conduction path terminals and a control terminal;

said first conduction path terminal of said first depletion-mode FET connected to said supply voltage terminal;

said second conduction path terminal and said control terminal of said first depletion-mode FET and said first conduction path terminal of each of said first and second enhancement-mode FETs, all connected to said first node defining said third output terminal of said exclusive/nor means;

said control terminal of said second enhancement-mode FET and said second conduction path terminal of said first enhancement-mode FET connected to said second node defining said first input terminal of said exclusive/nor means; and said control terminal of said first enhancement-mode FET and said second conduction path terminal of said second enhancement-mode FET connected to said third node defining said second input terminal of said exclusive/nor means.

8. The circuit according to claim 7:

in which said first logic means comprises a plurality of at least three stages, including a first stage and a final stage, all serially connected between said supply voltage terminal and said first input terminal of said exclusive/nor means; and in which said second logic means comprises a plurality of exactly one less stage than said first logic means including a first stage and a final stage, all serially connected between said supply voltage terminal and said second input terminal of said exclusive/nor means.

9. The circuit according to claim 8, in which each of said plurality of stages of both said first and second logic means comprises:

a transfer gate having input, output, and control terminals, said input terminal defining an input to said stage; and an inverter which is operated from said external power source having input and output terminals, said output terminal defining an output of said stage;

said output terminal of said transfer gate connected to said input terminal of said inverter;

said stages where connected to each other, connected so that said output of one stage is coupled to said input of a next adjacent following stage;

each of said inputs to said first stage of said first and second logic means connected to said supply voltage terminal, and each of said outputs of said final stage of said first and second logic means connected to said first and second inputs of said exclusive/nor means, respectively;

said clock signal coupled to said control terminal of alternate stages, starting with said last stage and proceeding toward said first stage in each of said first and second logic means;

said inverse signal coupled to all the remaining control terminals.

10. The circuit according to claim 9:

in which each of said transfer gates comprises a third enhancement-mode FET having first and second conduction path terminals and a control terminal corresponding to input, output, and control terminals of said transfer gate, respectively; and in which each of said inverters comprises a second depletion-mode FET and a fourth enhancement-mode FET, each of said FETs having first and second conduction path terminals and a control terminal;

said first conduction path terminal of said second depletion-mode FET connected to said supply voltage terminal, said second conduction path and control terminals of said second depletion-mode FET connected to said first conduction path terminal of said fourth enhancement-mode FET defining said output terminal of said inverter, said second conduction path terminal of said fourth enhancement-mode FET connected to said reference terminal, said control terminal of said fourth enhancement-mode FET defining said input terminal to said inverter which is connected to said second conduction path terminal of said third enhancement-mode FET;

said first conduction path terminal of said third enhancement-mode FET defining an input to said stage.

11. The circuit according to claim 10, in which all of said enhancement-mode and depletion-mode FETs are NMOS FETs.

12. A circuit for use on an integrated circuit chip for detecting the operative connection or disconnection of a crystal used to control an on-chip crystal controlled oscillator which generates a cyclical clock signal by detecting the presence or absence, respectively, of said cyclical clock signal and for providing an output control signal in response thereto to an on-chip terminal pad control circuit which automatically enables an on-chip terminal pad to be utilized as a clock signal output terminal pad if said cyclical clock signal presence is detected or as a clock signal input terminal pad otherwise, said circuit characterized by being operable from an external power source providing supply voltage and reference levels at supply voltage and reference terminals, respectively, and further characterized by being responsive to said cyclical clock signal which cycles between high and low states corresponding to said supply voltage and reference levels, respectively, and an inverse signal which is the logical complement of said cyclical clock signal, said circuit comprising:

first logic means having a first output terminal for providing a first logic signal at said first output terminal responsive to said supply voltage and reference levels and said clock and inverse signals;

second logic means having a second output terminal for providing a second logic signal at said second output terminal responsive to said supply voltage and reference levels and said clock and inverse signals; and exclusive/nor means having first and second input terminals and a third output terminal for performing an exclusive/nor logic function with respect to said first and second logic signals coupled to said first and second input terminals, respectively, and for outputting said output logic signal at said third output terminal in response thereto;

said first and second logic signals characterized by high and low logic states corresponding to supply voltage and reference levels, respectively, said first logic signal being set to a high state and said second logic signal being set to a low state if said cyclical clock signal has been present for more than one clock cycle and being set to the same state if said cyclical clock signal is absent;

the coincidence of like logic states at said first and second input terminals of said exclusive/nor means producing a logic high condition at said third output terminal of said exclusive/nor means, thereby causing said on-chip terminal pad control circuit to automatically enable said on-chip terminal pad to be utilized as a clock signal input terminal pad, and the coincidence of unlike logic level condition at said first and second terminals of said exclusive/nor means producing a logic low condition at said third output terminal of said exclusive/nor means, thereby causing said on-chip terminal pad control circuit to automatically enable said on-chip terminal pad to be utilized as a clock signal output terminal pad.

13. The circuit according to claim 12, in which said exclusive/nor means comprises:

first, second, and third nodes;

a first depletion-mode FET and first and second enhancement-mode FETs, each of said FETs having first and second conduction path terminals and a control terminal;

said first conduction path terminal of said first depletion-mode FET connected to said supply voltage terminal;

said second conduction path terminal and said control terminal of said first depletion-mode FET and said first conduction path terminal of each of said first and second enhancement-mode FETs, all connected to said first node defining said third output terminal of said exclusive/nor means;

said control terminal of said second enhancement-mode FET and said second conduction path terminal of said first enhancement-mode FET connected to said second node defining said first input terminal of said exclusive/nor means; and said control terminal of said first enhancement-mode FET and said second conduction path terminal of said second enhancement-mode FET connected to said third node defining said second input terminal of said exclusive/nor means.

14. A circuit for detecting the absence or presence of a cyclical clock signal and for providing an output logic signal corresponding thereto, said circuit characterized by being operable from an external power source providing supply voltage and reference levels at supply voltage and reference terminals, respectively, and further characterized by being responsive to said cyclical clock signal which cycles between high and low states corresponding to supply voltage and reference levels, respectively, and to an inverse signal which is the logical complement of said cyclical clock signal, said circuit comprising:

first logic means having a first output terminal for outputting a first logic signal at said first output terminal responsive to said supply voltage and reference levels and said clock and inverse signals;

second logic means having a second output terminal for outputting a second logic signal at said second output terminal responsive to said supply voltage and reference levels and said clock signal;

exclusive/nor means having first and second input terminals and a third output terminal for performing an exclusive/nor logic function with respect to said first and second logic signals coupled to said first and second input terminals, respectively, and for outputting said output logic signal at said third output terminal in response thereto;

said first and second logic signals characterized by high and low logic states corresponding to supply voltage and reference levels, respectively, said first logic signal being set to a high state and said second logic signal being set to a low state if said cyclical clock signal has been present for more than one clock cycle, and said first and second logic signals being set to the same state if said cyclical clock signal is absent; and the coincidence of either like or unlike logic states of first and second logic signals causing the logic state of said output logic signal to either be high or low, respectively.

15. The circuit according to claim 14:

in which said first logic means comprises first and second transfer gates, each transfer gate having input, output, and control terminals;

a first inverter, which is operated from said external power source, having input and output terminals;

said supply voltage terminal connected to said input terminal of said first transfer gate, said output terminal of said first transfer gate connected to said input terminal of said first inverter, said output terminal of said first inverter connected to said input terminal of said second transfer gate, said output terminal of said second transfer gate connected to said input terminal of said second inverter, and said output terminal of said second inverter connected to said first input terminal of said exclusive/nor means; and in which said second logic means comprises:

a third transfer gate having input, output, and control terminals;

a third inverter, which is operated from said external power source, having input and output terminals;

said supply voltage terminal connected to said input of said third transfer gate, said output terminal of said third transfer gate connected to said input terminal of said third inverter, said output terminal of said third inverter connected to said second input terminal of said exclusive/nor means;

said clock signal coupled to said control terminal of each of said second and third transfer gates; and said inverse signal coupled to said control terminal of said first transfer gate.

16. A crystal detect circuit for use on an integrated circuit chip for detecting the operative connection or disconnection of a crystal used to control an on-chip crystal controlled oscillator which generates a cyclical clock signal by detecting the presence or absence, respectively, of said cyclical clock signal and for providing an output control signal in response thereto to a float circuit which automatically enables an on-chip terminal pad to be utilized as a clock signal output terminal pad if the cyclical clock signal presence is detected or as a clock signal input terminal pad otherwise, said circuit characterized by being operable from an external voltage supply providing supply voltage and reference levels at supply voltage and reference terminals, respectively, and further characterized by being responsive to said cyclical clock signal which cycles between high and low states corresponding to said supply voltage and reference levels, respectively, and an inverse signal which is the logical complement of said cyclical clock signal, said circuit comprising:

first, second, third, fourth, fifth, and sixth nodes;

a first logic circuit comprising first, second, third, fourth, fifth, and sixth enhancement-mode and first, second, and third depletion-mode FETs;

a second logic circuit comprising seventh, eighth, ninth, and tenth enhancement-mode and fourth and fifth depletion-mode FETs; and an exclusive/nor logic circuit comprising eleventh and twelfth enhancement-mode and sixth depletion-mode FETs;

each of said first through twelfth enhancement-mode and first through sixth depletion-mode FETs having first and second conduction path terminals and a control terminal;

said second conduction path terminal of each of said first, third, fifth, seventh, and ninth enhancement-mode FETs connected to said control terminal of each of said second, fourth, sixth, eighth, and tenth enhancement-mode FETs, repectively;

said first conduction path terminal of each of said second and third enhancement-mode FETs and said second conduction path and control terminals of said first depletion-mode FET, all connected together to define said first node;

said first conduction path terminal of each of said fourth and fifth enhancement-mode FETs and said second conduction path and control terminals of said second depletion mode FET, all connected together to define said second node;

said first conduction path terminal of said sixth enhancement-mode FET and said second conduction path terminal of each of said eleventh enhancement-mode and third depletion-mode FETs and said control terminal of each of said third depletion-mode and said twelfth enhancement-mode FETs, all connected together to define said third node;

said first conduction path terminal of each of said eighth and ninth enhancement-mode FETs and said second conduction path and control terminals of said fourth depletion-mode FET, all connected together to define said fourth node;

said first conduction path terminal of said tenth enhancement-mode FET and said second conduction path terminal of each of said twelfth enhancement-mode and fifth depletion-mode FETs, and said control terminal of each of said eleventh enhancement-mode and fifth depletion-mode FETs, all connected together to define said fifth node;

said supply voltage terminal connected to said first conduction path terminal of each of said first through sixth depletion-mode and first and seventh enhancement-mode FETs;

said reference terminal connected to said second conduction path terminal of each of said second, fourth, sixth, eighth, and tenth enhancement-mode FETs;

said clock signal coupled to said control terminal of each of said first, fifth, and ninth enhancement-mode FETs;

said inverse signal coupled to said control terminal of each of said third and seventh enhancement-mode FETs;

said first conduction path terminal of each of said eleventh and twelfth enhancement-mode FETs and said second conduction path and control terminals of said sixth depletion-mode FET, all connected together to define said sixth node, upon which node is provided said output control signal which automatically enables said on-chip terminal pad to be utilized as a clock signal output terminal pad if the cyclical clock signal presence is detected or as a clock signal input terminal pad, otherwise.

17. The method of automatically switching the function of a terminal pad on an integrated circuit chip to function as a clock signal output terminal pad or as a clock signal input terminal pad in accordance with detecting the existence or non-existence of a cyclical clock signal generated on-chip and available thereon, said method comprising the steps of:

generating first and second logic signals characterized by high and low logic states in response to detecting the presence or absence of said cyclical clock signal, causing said first logic signal to be set to a high state and said second logic signal to be set to a low state if said cyclical clock signal has been present for more than one cycle;

causing said first and second logic signals to be set to the same state if said cyclical clock signal has not been present;

performing exclusive/nor logic on said first and second logic signal and thereby producing an output logic signal in conformance therewith; and coupling said output logic signal to a float control circuit used in conjunction with an output clock signal driver circuit outputting said clock signal on said on-chip terminal pad;

causing said float control circuit to float said terminal pad and allowing said terminal to function as a clock signal input terminal pad if said on-chip generated cyclical clock signal is not detected and causing said terminal pad to be driven by said on chip-generated clock signal and thereby allowing said terminal pad to function as a clock signal output terminal pad if said on-chip generated cyclical clock signal is detected.

* * * * *